United States Patent [19]

Lindebrings et al.

[11] 4,229,879

[45] Oct. 28, 1980

[54] MANUFACTURE OF PRINTED CIRCUIT BOARDS

[75] Inventors: Charles M. P. Lindebrings, Ivry; Pierre Vaillagou, St. Remy les Chevreuse; André J. F. Velte, Le Chesnay, all of France

[73] Assignee: Societe Anonyme de Telecommunications, Paris, France

[21] Appl. No.: 924,228

[22] Filed: Jul. 13, 1978

[30] Foreign Application Priority Data

Jul. 28, 1977 [FR] France ................. 77 23251

[51] Int. Cl.³ ............... H05K 3/06; H05K 3/22; H05K 3/34
[52] U.S. Cl. ........................... 29/840; 29/847; 427/97; 430/312; 430/313; 430/314
[58] Field of Search ............ 29/626, 625; 427/97; 96/33, 38.4; 430/312, 313, 314

[56] References Cited

U.S. PATENT DOCUMENTS

| | | | |
|---|---|---|---|
| 2,699,424 | 1/1955 | Nieter | 29/625 |
| 2,848,359 | 8/1958 | Talmey | 427/97 X |
| 2,897,409 | 7/1959 | Gitto . | |
| 3,034,930 | 5/1962 | Foudriat, Jr. | 29/626 X |
| 3,610,811 | 10/1971 | O'Keefe | 29/626 X |
| 3,708,876 | 1/1973 | Klehm, Jr. | |
| 3,773,514 | 11/1973 | Fromson | 96/33 X |
| 4,054,483 | 10/1977 | Peiffer | 96/38.4 X |
| 4,101,322 | 7/1978 | Lawson | 96/33 |

FOREIGN PATENT DOCUMENTS

1120583 7/1968 United Kingdom .

*Primary Examiner*—Francis S. Husar
*Assistant Examiner*—C. J. Arbes
*Attorney, Agent, or Firm*—Jacobs & Jacobs

[57] ABSTRACT

The present invention relates to a process for producing two-sided printed circuit boards with metal-coated holes from insulating supports made of glass-synthetic resin laminate, in which the holes to be metal-coated are punched through the insulating support, a deposit of conductive metal is effected by chemical metal-coating in the holes and on the two faces, wiring is made by etching the conductive metal on the two faces after having deposited a reserve, then the electrical components are positioned in the metal-coated holes and the tails of the components are soldered in the respective holes to insure the electrical connections. Immediately after the holes have been punched, the support is coated with a positive-action photosensitive resin and the coated support is exposed to a radiation capable of destroying the resin, then it is dried.

3 Claims, 4 Drawing Figures

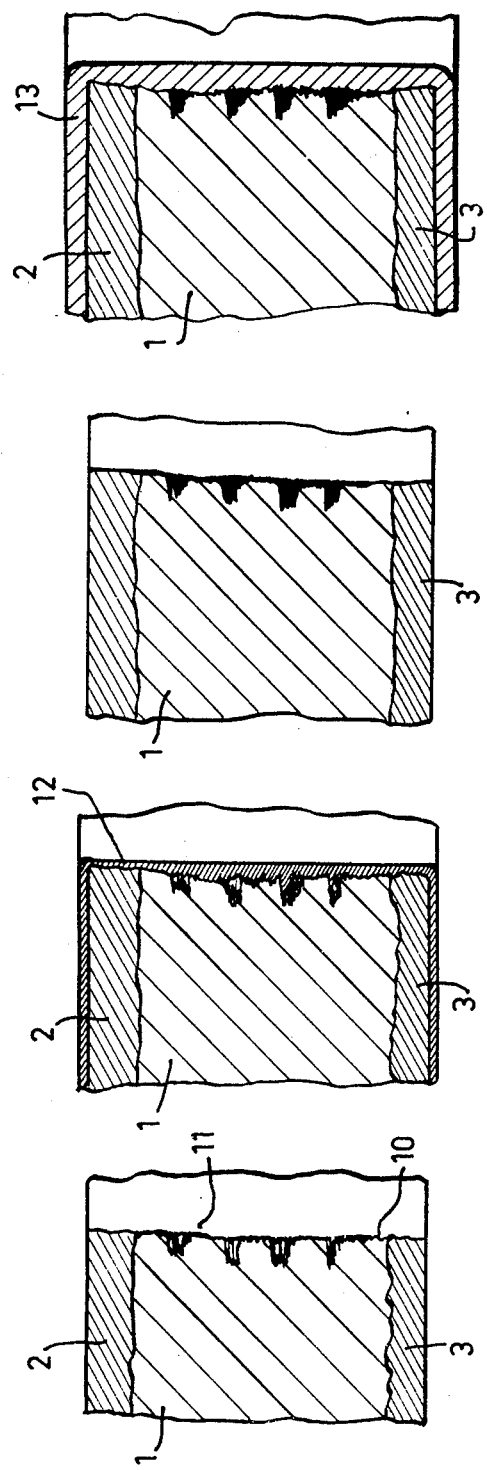

MANUFACTURE OF PRINTED CIRCUIT BOARDS

The present invention relates to the production of double-sided printed circuit boards having metal-coated holes from insulating supports made of glass-synthetic resin laminate, for example of glass-epoxy or glass-polyimide laminate.

In the conventional process for producing double-sided printed circuit boards, the holes bo be metal-coated are punched through the dielectric support, a deposit of conductive metal is effected by chemical metal-coating in the holes and on the two faces, the wiring is effected by etching the conductive metal on the two faces after having deposited a reserve, then the electrical components are positioned in the metal-coated holes and the tails of the components are soldered in the respective holes to insure the electrical connections.

The quality of the soldered joints thus formed in the metal-coated holes is essential for the reliability of the circuit, and these joints must be free from bubbles and cracks or craters.

Now, with the supports made of glass-resin laminate, the presence of such defects is precisely observed somewhat frequently. The reason for this is as follows: The wall of such a support presents resin regions and glass fibers regions which are considerably disturbed when the holes are punched. Cavities are then formed along the wall, as well as micro-separations of the glass fibers. Impurities penetrate in these cavities during the surface treatments prior to the chemical metal-coating. The chemical solutions in contact with the wall penetrate by capillarity along the strands of glass and leave residues which cannot be eliminated by rinsing and which are trapped by the subsequent metal-coating step.

With high-speed soldering, such as wave soldering, these residual impurities diffuse towards the outside under the action of the temperature and alter the quality of the soldered joint, giving rise to the formation of bubbles, cracks or craters.

This results in risks of electrical discontinuity, short-circuit, or even detachment of the welded joint. An additional touch-up solder operation with a soldering iron is then necessary to insure the reliability of the joint. Such an operation must be carried out by hand and is therefore very expensive.

It is an object of the invention to provide a process of the type mentioned above, which does not present the drawback indicated.

According to the invention, immediately after the holes have been punched, the support, particularly the inner surface of the holes, is coated with a positive-action photosensitive resin and the coated support is exposed to a radiation capable of destroying the resin, then it is dried.

During the coating, resin penetrates into the cavities formed at the time of punching the holes. The resin present in these cavities is then sheltered from the radiation and is not destroyed. In this way, the cavities are sealed, this preventing the penetration of impurities during the subsequent treatments and therefore the formation of residues between the material of the support and the metal-coating layer.

The invention will be more readily understood on reading the following description with reference to the accompanying drawings, which all show in cross-sectional view a two-sided printed circuit board, in the region of a hole to be metal-coated, at various steps of the process:

FIG. 1a shows the board after the holes have been punched;

FIG. 1b illustrates the step of coating the resin;

FIG. 1c shows the board after removal of the irradiated resin; and

FIG. 1d shows the metal-coating of the hole.

FIG. 1a shows a support made of glass-resin, for example glass-epoxy laminate. The laminate 1 is sandwiched between two copper clads 2 and 3. The presence of these clads avoids having to make too thick a metal-coating deposit, but it is not critical in the invention.

The support has been punched with a hole 10, which alters the structure of the laminate, creating cavities or anfractuosities 11.

FIG. 1b shows the support after coating with a layer 12 of photo-sensitive resin paste. This layer covers the wall of the hole 10 and penetrates in the cavities 11.

The coating is effected by any appropriate means, for example by dipping, centrifugation or vacuum pulverisation.

This step is preferably effected in vacuo so as to drive the air out of the cavities.

FIG. 1c shows the situation after exposure to a suitable radiation. The resin has been rendered soluble by the light energy, except in the zones sheltered from the radiation, i.e. precisely in the cavities 11. After a drying intended to harden the resin, the cavities 11 are perfectly filled in.

The cycle of chemical (electroless) metal-coating may then take place without risk of impurities penetrating in said cavities during the chemical treatments provided at the beginning of this cycle, before the actuaL metal-coating.

FIG. 1d shows the support once the metal-coated deposit has been effected. No residue remains between the insulating support, of which the cavities have been filled in by the photosensitive resin and the metal-coating layer 13, for example of copper.

The process of chemical metal-coating is conventional and it is unnecessary to describe it in detail. It will simply be indicated that the metal-coating cycle comprises a stage of surface-treating the support, comprising treatments which depend on the material of the support and intended to create an embossing, a stage of implantation of germs, particularly palladium, in the sites for attachment thus created (operation called "catalysis"), and finally the actual deposit of conductive metal.

The following treatment is also conventional: an electrolytic deposit of the conductive metal is effected to reinforce the chemical deposit, a reserve is deposited according to the wiring to be made, a further electrolytic deposit is effected up to the total thickness desired, then an anti-corrosive electrolytic deposit (for example tin-lead), the reserve is eliminated and the copper located beneath the reserve is etched. The components may then be positioned and soldered.

The positive action photosensitive resin used for coating the support must comply with precise characteristics:

It must have electrical properties suitable for use in a printed circuit board, and particularly a high dielectric coefficient.

It must have a sufficient thermal resistance to resist the soldering temperatures, of about 200–250° C.

It must have an excellent resistance to the chemical agents in order not to be destroyed by the products present in the treatment baths used in the metal-coating cycle.

Such a resin comprises for example a phenol-formaldehyde resin, the unit of which corresponds to the following formula:

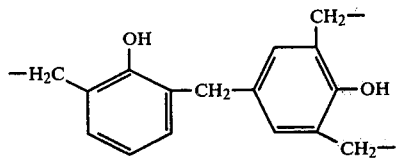

or cresol-formaldehyde resins of similar structure, obtained by reaction of formaldehyde with phenol (or cresol).

This resin is sensitized by a diazo sensitizer, for example an O-diazoquinone-sulfone of formula:

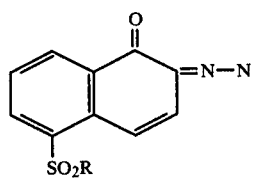

R being an organic radical. This sensitizer initiates the photosolubilisation in accordance with the reaction:

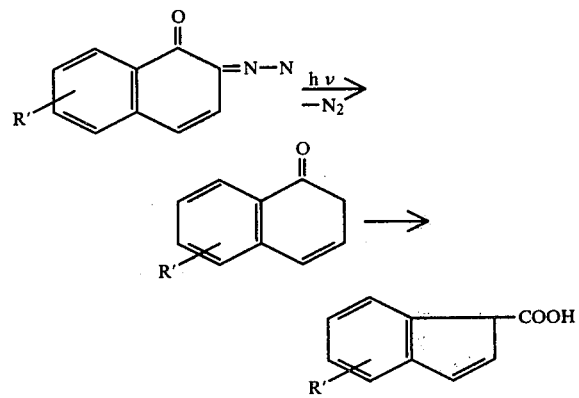

the final product being an indene-carboxylic acid.

The light radiation which is used in this case is an ultra-violet radiation produced by a mercury lamp.

We claim:

1. A process for producing two-sided printed circuit boards with metal-coated holes from insulated supports made of glass-synthetic resin laminate, which comprises
   punching the holes to be metal-coated in the support,
   coating the punched support, at least in the inner surface of the holes, with a positive-action photosensitive resin,
   exposing the entire coated support to radiation capable of destroying said resin,
   drying the support,
   depositing conductive metal by chemical metal-coating in the holes on both faces of the support,
   depositing a reserve in accordance with the pattern of a desired circuit,
   etching the conductive metal on both faces,
   positioning electrical components in the metal-coated holes and soldering the tails of the components in the respective holes to provide for connections.

2. A process as claimed in claim 1, comprising the coating in vacuo.

3. A process as claimed in claim 1, comprising providing said the photosensitive resin comprised of a phenol-formaldehyde resin, corresponding to the following formula:

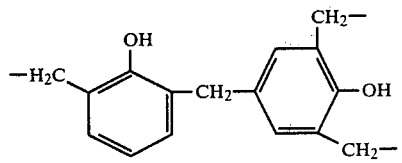

or a cresol formaldehyde resin of similar structure, associated with a diazo sensitizer of formula:

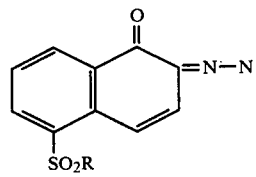

where R is an organic radical.

* * * * *